United States Patent
Wu

[11] Patent Number: 5,994,747
[45] Date of Patent: Nov. 30, 1999

[54] MOSFETS WITH RECESSED SELF-ALIGNED SILICIDE GRADUAL S/D JUNCTION

[75] Inventor: Shye-Lin Wu, Hsinchu, Taiwan

[73] Assignee: Texas Instruments-Acer Incorporated, Hsinchu, Taiwan

[21] Appl. No.: 09/023,454

[22] Filed: Feb. 13, 1998

[51] Int. Cl.⁶ .......... H01L 29/76; H01L 31/062
[52] U.S. Cl. .......... 257/408; 257/344; 257/411; 257/623
[58] Field of Search .......... 257/327, 344, 257/639, 407, 408, 410, 411, 623

[56] References Cited

U.S. PATENT DOCUMENTS

| | | | |
|---|---|---|---|
| 5,146,291 | 9/1992 | Watanabe et al. | 257/344 |
| 5,183,771 | 2/1993 | Mitsui et al. | 438/302 |
| 5,258,645 | 11/1993 | Sato | 257/637 |
| 5,362,982 | 11/1994 | Hirase et al. | 257/408 |
| 5,369,297 | 11/1994 | Kusunoki et al. | 257/411 |
| 5,372,957 | 12/1994 | Liang et al. | 438/302 |
| 5,498,556 | 3/1996 | Hong et al. | 438/302 |
| 5,719,425 | 2/1998 | Akram et al. | 257/344 |
| 5,721,443 | 2/1998 | Wu | 257/344 |
| 5,780,901 | 7/1998 | Yoshitomi et al. | 257/336 |
| 5,828,103 | 10/1998 | Hsu | 257/344 |

*Primary Examiner*—Jerome Jackson, Jr.
*Assistant Examiner*—George C. Eckert, II
*Attorney, Agent, or Firm*—Harness, Dickey & Pierce, P.L.C.

[57] ABSTRACT

The present invention includes a gate oxide. A gate is formed on the gate oxide. Undercut portions, formed under the gate. The substrate has recessed portions are adjacent to the gate. A silicon oxynitride layer is formed on the side walls of the gate and refilled into the undercut portions to be used as a portion of the gate oxide. Side wall spacers are formed on the side walls of the gate. A polycide layer is formed at the top of the gate to reduce the electrical resistance. Source and drain regions are formed in the recessed portions of the substrate. Lightly doped drain (LDD) structures are formed in the substrate adjacent to the gate and under the gate oxide. Extended source and drain are formed between the source and drain and the LDD structure to suppress the short channel effect. Self-aligned silicide (SALICIDE) layers are formed at top of the source and drain.

9 Claims, 3 Drawing Sheets

MOSFETS WITH RECESSED SELF-ALIGNED SILICIDE GRADUAL S/D JUNCTION

The present invention relates to a semiconductor device, and more specifically, to a method of fabricating a metal oxide semiconductor field effect transistor (MOSFET) for used in integrated circuits.

BACKGROUND OF THE INVENTION

Metal oxide semiconductor field effect transistor (MOSFET) is one of the important devices for integrated circuits. As the trend of miniaturizing the integrated circuits, the fabrication of the MOSFET also meets various issues to miniaturize them. The typically issue that relates to hot carriers injection is overcame by the development of lightly doped drain (LDD) structure. However, when the transistor is scaled down to submicron range, the transistor suffers the hot electron problem again. It is because that the transistor has short channel length and high supply power. The electric field strength in the devices is increased, thus the energetic electrons will inject into the silicon-oxide interface and be trapped within the gate oxide. Wei has suggested a buried and graded LDD structure to improve the hot electron reliability as seen in the article "Buried and Graded/Buried LDD Structure for Improved Hot-Electron Reliability, Ching-Yeu Wei, IEEE Electron Device Lett., 1986".

Lo has proposed a method to suppress the hot carrier induced degradation. In this technique, gate oxide is grown in pure $N_2O$ ambient at 950 degrees centigrade. It reports that the $N_2O$ gate oxide has significantly enhanced hot carrier immunity. Further, under the Fowler-Nordheim injection stress, the devices show an enhanced degradation with decreasing channel length and increasing channel width. Please see "Dependence of Hot-Carrier Immunity on Channel Length and Channel Width in MOSFET's with $N_2O$-Grown Gate Oxides, G. Q. Lo, et al., IEEE, Electron Device Lett.,1992".

In addition, the requirement of the devices is that the devices exhibit high operation speed and low operation power. For deep sub-micron meter MOS devices, the self-aligned silicide (SALICIDE) contact, ultra-shallow source and drain junction are used for improving the operation speed and short channel effect as seen in reference "High Performance 0.15 $\mu$m Single Gate Co Salicide CMOS, T. Yoshitomi et al., 1996, Symposium on VLSI Technology Digest of Technical papers". The conventional $TiSi_2$ suffers a serious problem relating to the sheet resistance increase of the fine line. Thus, in the technology, the $CoSi_2$, NiSi have been used for deep sub-micron high speed CMOS due to the low sheet resistance of fine silicide line. The MOSFETs have extension region to suppress the short channel effect and achieve the high speed operation.

Another issue is relating to the supply power of the devices. When the supply-voltage is reduced, the threshold voltage needs to be scaled down to achieve the desired circuit switching speed. IBM has proposed that CMOS employs non-uniform channel doping profiles and ultra-shallow source and drain extensions and halos, which can be referenced in "CMOS technology scaling 0.1 $\mu$m and beyond, IBM semiconductor research and development center, Bijan, Davari, IEDM, 96-555, 1996". For the high performance case, the threshold voltage is scaled down less than the supply voltage in order to maintain a reasonable standby current.

Further, in order to achieve the purpose of the present invention, an anti-reflective coating technology is used to improve the resolution of lithography. This can reference to the article "CVD $SiN_x$ Anti-reflective Coating for Sub-0.5 $\mu$m Lithography, T. P. Ong, 1995, Symposium on VLSI Technology Digist of Technical Papers". The $SiN_x$ material can provide excellent anti-reflective layer that meets the requirement of the advanced integrated circuits. This material also be utilized to fabricate SRAM as the bottom anti-reflective coating (BARC). In addition, the present invention uses an etchant suggested by Mitani to form a recess portion of silicon substrate. The etchant exhibits high selectivity to silicon oxide for etching, and low damage for silicon. Please see "Buried Source and Drain (BSD) Structure for Ultra-shallow Junction Using Selective Deposition of Highly Doped Amorphous Silicon, Y. Mitani, 1996, Symposium on VLSI Technology Digist of Technical Papers"."

SUMMARY OF THE INVENTION

The present invention includes a gate oxide formed on a substrate. A gate is formed on the gate oxide. Undercut portions formed under the gate. The substrate has recessed portions adjacent to the gate. A silicon oxynitride layer is formed on the side walls of the gate and refilled into the undercut portions to act as a portion of the gate oxide. Side wall spacers are formed on the side walls of the gate and on a portions of the silicon nitride layer. Thus, the slicon oxynitride layer is between the gate and the side wall spacers. A polycide layer is formed at the top of the gate to reduce the selectrical resistance. Source and drain regions are formed in the recessed portions. Lightly doped drain (LDD) structures are formed in the substrate adjacent to gate and under the gate oxide. Extended source and drain are gradually formed between the source and drain and the LDD structure to suppress the short channel effect. Self-aligned silicide (SALICIDE) layers are formed at top of the source and drain to reduce the electrical resistance.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel method to fabricate a MOSFET with recessed self-aligned silicide gradual source and drain (S/D) junctions. In the present invention, the device operation speed can be increased by using the SALICIDE technology. The short channel effect can be suppressed by using the recessed gradual source and drain (S/D) junction. Further, the present invention uses the $N_2O$ silicon oxynitride layer as gate dielectric. The detailed description according to the present invention will be seen as follows.

Figure 9:
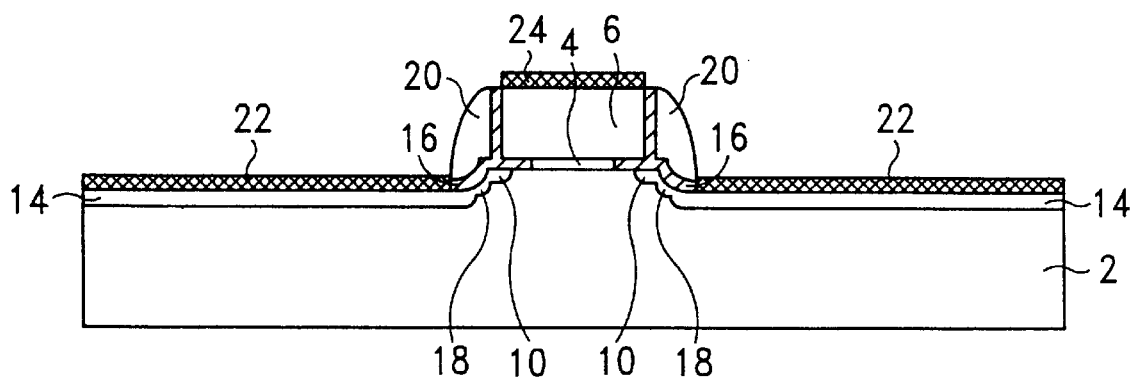
FIG. 9 is a cross sectional view of a semiconductor wafer illustrating the step of forming self-aligned silicide according to the present invention.

As shown in FIG. 9, the present invention includes a gate oxide 4 formed on a substrate 2. A gate is formed on the gate oxide 4. The present invention has undercut portions 15 formed under the gate 6. The substrate 2 has recessed portions 13 adjacent to the gate 6. A silicon oxynitride layer 16 is formed on the side walls of the gate 6 and refilled into the undercut portions 15 to act as a portion of the gate oxide for enhancing hot carrier immunity.

Side wall spacers 20 are formed on the side walls of the gate 6 and on portions of the silicon oxynitride layer 16. Thus, the slicon oxynitride layer 16 is between the gate 6 and the side wall spacers 20. A polycide layer 24 is formed at the top of the gate 6 to reduce the electrical resistance. Source and drain regions 14 are formed in the recessed portions 13 of the substrate 2. Lightly doped drain (LDD) structures 10 are formed in the substrate 2 adjacent to gate 6 and under the gate oxide. Extended source and drain 18 are formed between the source and drain 14 and the LDD structure 10 to suppress the short channel effect. Self-aligned silicide (SALICIDE) layers 22 are formed at top of the source and drain 14 to reduce the electrical resistance.

Figure 1:
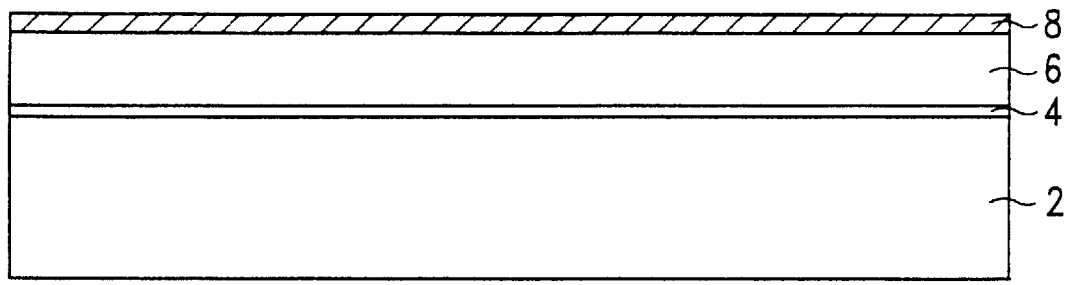
FIG. 1 is a cross sectional view of a semiconductor wafer illustrating the steps of forming a gate oxide, polysilicon layer and a silicon nitride layer on a semiconductor substrate according to the present invention.

The formation of the present invention can be seen below. Turning to FIG. 1, a single crystal silicon substrate 2 with a <100> crystallographic orientation is provided. A thin gate oxide layer 4 consisted of silicon oxide is formed on the substrate 2 Typically, the gate oxide 4 can be grown in oxygen ambient at a temperature of about 700 to 1100 degrees centigrade. Other method, such as chemical vapor deposition, can also be used to form the gate oxide 4. In the embodiment, the thickness of the silicon dioxide layer 4 is approximately 15–250 angstroms. Subsequently, a polysilicon layer 6 is deposited on the gate oxide layer 4. Generally, the polysilicon layer 6 can be chosen from doped polysilicon or in-situ polysilicon. For an embodiment, the doped polysilicon layer 6 is doped by phosphorus using a $PH_3$ source. Then, a silicon nitride layer ($SiN_x$) 8 is deposited on the polysilicon layer 6 to act as an anti-reflective coating (ARC) layer to improve the resolution of lithography. The silicon nitride layer 8 can be deposited by any suitable process. As known by a person of ordinary skills in the art, the silicon nitride layer 8 can be formed using Low Pressure Chemical Vapor Deposition (LPCVD), Plasma Enhance Chemical Vapor Deposition (PECVD), and so on. Further, the temperature for forming the silicon nitride layer 8 is at a range of 400–800° C. In the preferred embodiment, the reaction gases of the step to form silicon nitride layer 26 are $SiH_4$, $NH_3$, $N_2$, $N_2O$ or $SiH_2Cl_2$, $NH_3$, $N_2$, $N_2O$.

Figure 2:
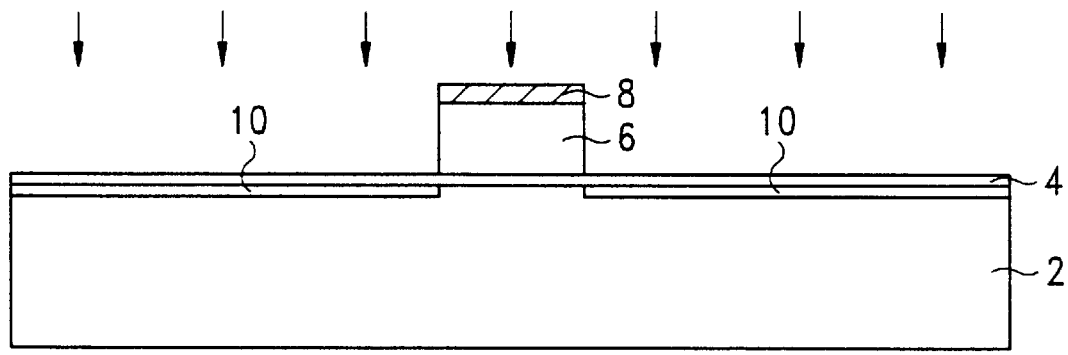
FIG. 2 is a cross sectional view of a semiconductor wafer illustrating the steps of forming a gate structure and LDD structure according to the present invention.

Next, referring to FIG. 2, standard lithography and etching steps are used to etch the ARC layer 8, polysilicon layer 6 to the surface of the gate oxide layer 4 for forming a gate structure consisting of the gate oxide layer 4 and the polysilicon layer 6. An ion implantation is carried out to dope dopant in to the substrate 2 by using the gate structure as a mask. In this step, lightly doped drain (LDD) 10 is formed adjacent to the gate structure to reduce the hot carriers. The dosage and the ion implantation energy of the step are respectively about 5E12 to 5E14 atoms/$cm^2$, about 5 to 80 KeV. The gate oxide 4 also acts as a buffer during the ion implantation.

Figure 3:
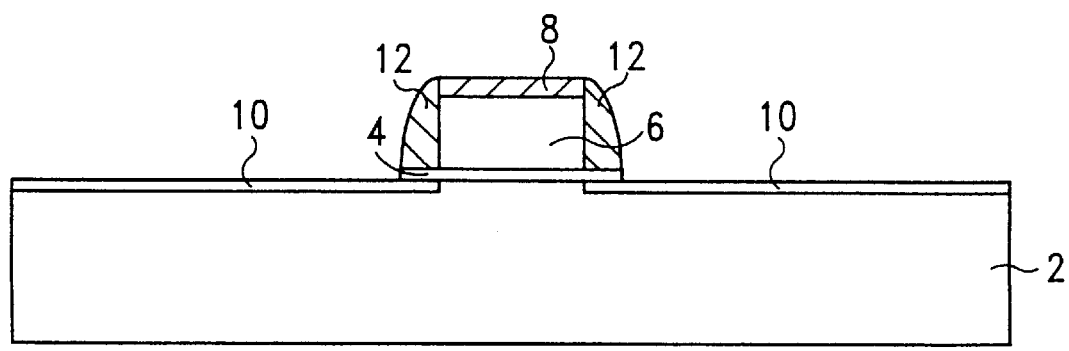
FIG. 3 is a cross sectional view of a semiconductor wafer illustrating the step of forming side wall spacers on the side walls of the gate structure according to the present invention.

Subsequently, please see FIG. 3, a silicon nitride layer 12 is formed along the surface of substrate 2, and substantially conformally covered the gate structure. In a case, the silicon nitride layer is formed by chemical vapor deposition. Then, an anisotropical etching is used to etch the silicon nitride layer, thereby generating side wall spacers 12 on the side walls of the gate structure. As well known in the art, the etchant to etch the silicon nitride can be chosen from $CF_4/H_2$, $CHF_3$, $CH_3CHF_2$. By the way, the gate oxide layer 4 that is exposed by the gate structure is also removed during the etching.

Figure 4:
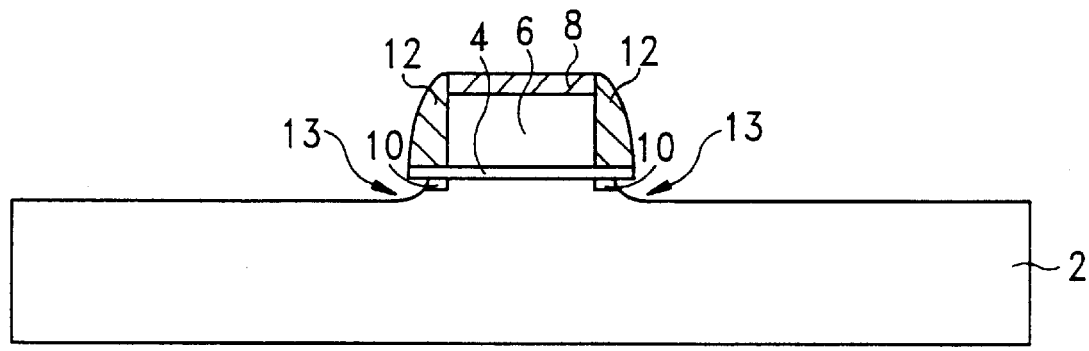
FIG. 4 is a cross sectional view of a semiconductor wafer illustrating the step of slightly recess the substrate according to the present invention.

Turning to FIG. 4, the silicon substrate 2 is slightly recessed by chemical dry etching (CDE) to generate recess portions 13 under a portion of the side wall spacers 12. Further, the substrate 2 that is used to form the S/D region is also recessed. Preferably, an etching technique with fluorine radicals is used to attack the silicon substrate 2. This method has high selectivity to silicon oxide, isotropy for etching the silicon substrate 2 under the side wall spacers 12. Another benefit of this technique is low damage for silicon, which is referred to soft dry etching. Portions of LDD structure 10 is still remained in the substrate under the side wall spacers 12.

Figure 5:
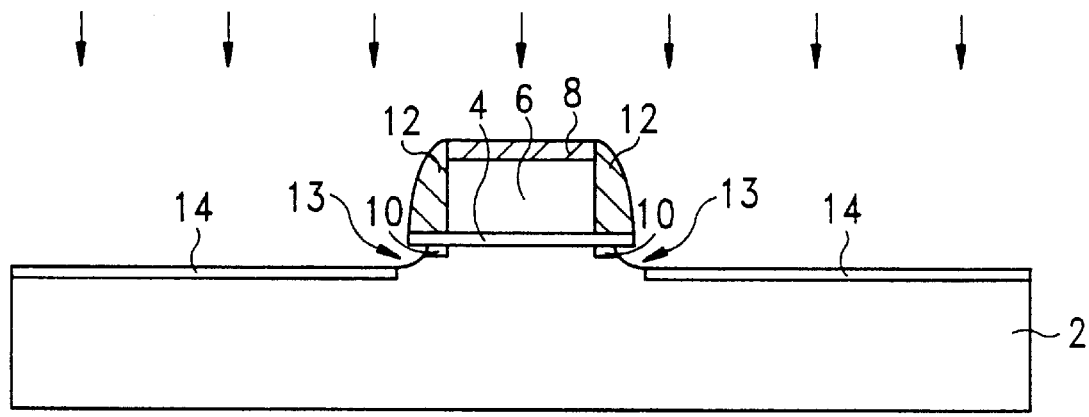
FIG. 5 is a cross sectional view of a semiconductor wafer illustrating the step of forming source and drain according to the present invention.

Then, an ion implantation is performed to implant ions into the gate, the substrate using the gate structure, the side wall spacers 12 as a mask to form source and drain (S/D) 14 in the recessed semiconductor substrate, as shown in FIG. 5. In the preferred embodiment, low energy and high dose ion implantation is introduced in this step. Thus, the S/D 14 has shallow junctions. Preferably, the dosage and energy of the ion implantation are respectively about 1E14 to 1E16 atoms/$cm^2$, about 1 to 40 KeV. The S/D 14 exhibits gradual junctions due to the substrate 2 owns the recessed portions. This S/D structure having recessed gradual S/D junctions will improve the short channel effect.

Figure 6:
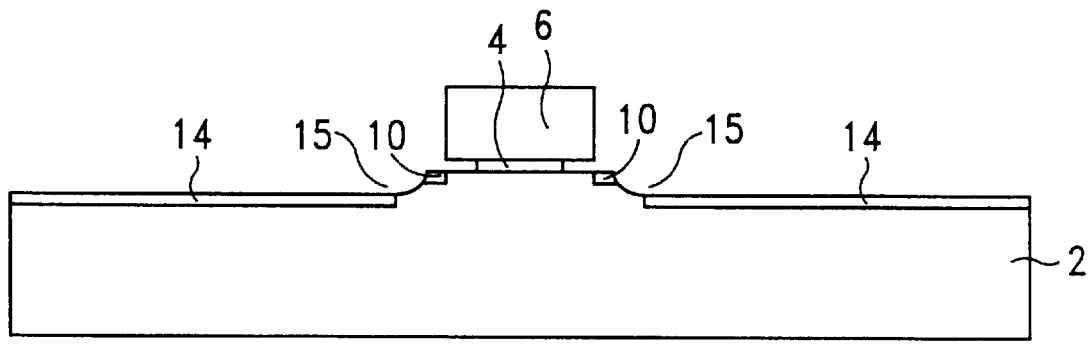
FIG. 6 is a cross sectional view of a semiconductor wafer illustrating the step of removing silicon nitride layer according to the present invention.

Turning to FIG. 6, the silicon nitride layer 8 formed on the gate 8 and the side wall spacers 12 are removed to expose the gate structure. Typically, the silicon nitride can be stripe by using hot phosphorus acid solution. Subsequently, diluted HF solution is used to remove the fringe portion of the gate oxide 4, thereby forming undercut portions 15 under the gate 6.

Figure 7:
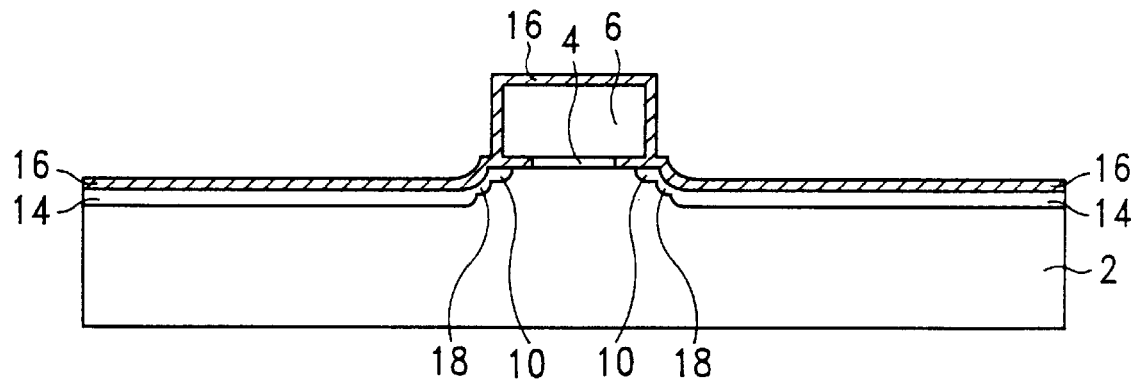
FIG. 7 is a cross sectional view of a semiconductor wafer illustrating the step of forming a silicon oxynitride layer according to the present invention.

Referring to FIG. 7, subsequently, an ultra-thin silicon oxynitride layer 16 is formed on the substrate 2, and substantially conformally covered the gate structure. The silicon oxynitride layer is also refilled into the undercut portions 15. In a case, the silicon oxynitride layer 16 is formed by thermal oxidation in $N_2O$ or NO environment. The temperature for forming the silicon oxynitride layer 16 ranges from 700 to 1150 centigrade degrees. The thickness of the silicon oxynitride layer 16 is about 30 to 300 angstroms. The silicon oxynitride layer 16 will suppress the hot carrier induced degradation. The undercut portions refilled with the silicon oxynitride layer 16 acts as a portion of the gate oxide. Thus, the gate oxide has significantly enhanced hot carrier immunity. As well known in the art, the etching and ion implantation will cause substrate damage. Thus, the thermal oxidation used to form the silicon oxynitride layer 16 will recover the surface damage of the substrate 2. It has to be noted that extended S/D 18 is also formed between the S/D 14 and the LDD 10 by the thermal oxidation. The LDD 10 is higher than the extended S/D 18, and the extended S/D 18 is higher than the S/D regions 14, thereby forming the recessed gradual source and drain junctions.

Figure 8:
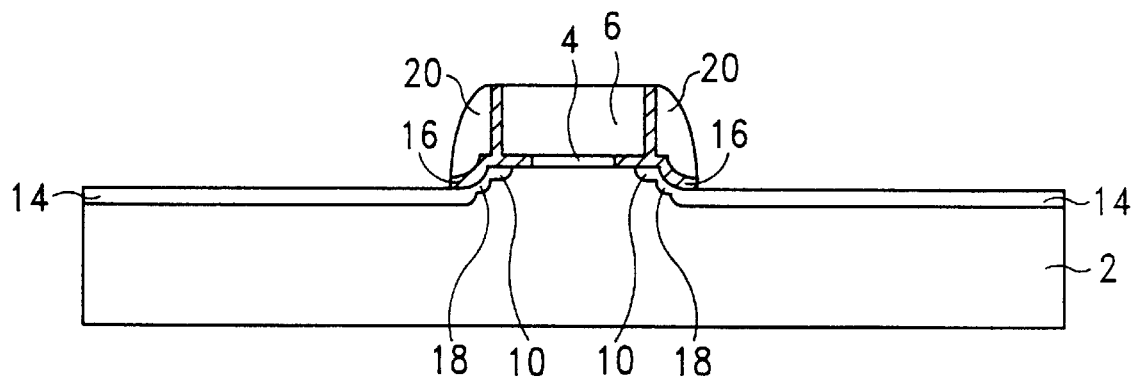
FIG. 8 is a cross sectional view of a semiconductor wafer illustrating the step of forming a CVD side wall spacers according to the present invention.

Referring to FIG. 8, an oxide layer 20 is formed over the substrate 2 and gate structure. For example, CVD oxide can be used for in this step. Then, an anisotropical etching is performed to etch the CVD oxide 20. As known in the art, side wall spacers 20 are formed on the side walls of the gate structure.

As shown in FIG. 9, self-aligned silicide (SALICIDE) layer 22, polycide layer 24 are respectively formed on the S/D 14, and on the polysilicon gate 6. Typically, this can be achieved by using well known processes. For example, a refractory metal layer, such as Ti, Pt, Co, W, Ni etc, is sputtered on the substrate 2, gate structure. Then, a first-step rapid thermal annealing (RTA) at 350 to 700 degrees centigrade in $N_2$ ambient is performed to react the refractory metal with the polysilicon gate 6 and the silicon substrate 2, thereby forming silicide on these portions. Then, a strip step is used to remove non-reactive refractory metal on the CVD side wall spacers 20. Therefore, the SALICIDE layer 22, polycide layer 24 are self-aligned formed on these regions. Further, the dopants in the S/D 14 are driven deeper into the substrate 2 to expanse the S/D 14 by another high temperature RTA. The temperature of the second-step RTA is about 800–1100 degrees centigrade. The self-aligned silicide contact will increase the operation speed of the devices.

The present invention can provide various benefits over the prior art. For example, the operation speed will be increased by the SALICIDE technology. The short channel effect will be suppressed by using the gradual S/D junctions, and the extended ultra-shallow S/D junction.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A structure of a transistor with recessed self-aligned silicide gradual source and drain junctions on a semiconductor substrate, the structure including:

a gate oxide formed on said semiconductor substrate;

a gate formed on said gate oxide, said gate having undercut portions formed under said gate, wherein said semiconductor substrate has recess portions adjacent to said gate;

a silicon oxynitride layer conformally formed on a surface of said gate and refilled into said undercut portions to be used as a portion of said gate oxide to enhance hot carrier immunity;

side wall spacers formed on said side walls of said gate and on a portion of said silicon oxynitride layer, said silicon oxynitride layer being between said gate and said side wall spacers;

a polycide layer formed at a top of said gate to reduce the electrical resistance;

recessed source and drain (S/D) regions formed in said recess portions;

lightly doped drain (LDD) structures formed in said semiconductor substrate adjacent to said gate and under said gate oxide;

extended source and drain SID gradually formed between said source and drain and said LDD structure to suppress the short channel effect, wherein said LDD structure is higher than said extended S/D, and said extended S/D is higher than said S/D regions, thereby forming recessed gradual source and drain junctions; and self-aligned silicide (SALICIDE) layers formed at a top of said source and drain to reduce the electrical resistance.

2. The structure of claim 1, wherein said side wall spacers comprise oxide.

3. The structure of claim 1, wherein said lightly doped drain structures have a dosage of about 5E12 to 5E14 atoms/cm$^2$.

4. The structure of claim 1, wherein said source and drain have a dosage of about 1E14 to 1E16 atoms/cm$^2$.

5. The structure of claim 1, wherein said silicon oxynitride layer comprises a thickness of about 30 to 300 angstroms.

6. The structure of claim 1, wherein said gate oxide comprises a thickness of about 15 to 200 angstroms.

7. The structure of claim 1, wherein said polycide layer comprises one or more conductive materials selected from a group consisting of Ti, Pt, Co, W, and Ni.

8. The structure of claim 1, wherein said self-aligned silicide layers comprise one or more conductive materials selected from a group consisting of Ti, Pt, Co, W, and Ni.

9. The structure of claim 1, wherein said gate comprises doped polysilicon.

* * * * *